United States Patent [19]

Ahn

[11] Patent Number: 5,333,136
[45] Date of Patent: Jul. 26, 1994

[54] PARALLEL DATA TRANSFERRING AND PROCESSING CIRCUIT

[75] Inventor: Byung E. Ahn, Seoul, Rep. of Korea

[73] Assignee: SamSung Electronics Co., Ltd., Suwon, Rep. of Korea

[21] Appl. No.: 728,580

[22] Filed: Jul. 11, 1991

[30] Foreign Application Priority Data

Oct. 24, 1990 [KR] Rep. of Korea .................... 90-17014

[51] Int. Cl.$^5$ ............................................. H04J 3/04
[52] U.S. Cl. .................................... 370/112; 370/111; 370/105.5; 375/113
[58] Field of Search ..................... 370/112, 111, 105.5; 375/113

[56] References Cited

U.S. PATENT DOCUMENTS

| 3,654,492 | 4/1972 | Clark | 375/113 X |
| 4,141,039 | 2/1979 | Yamamoto | 375/122 X |
| 4,439,857 | 3/1984 | Rauth et al. | 370/105.5 |
| 4,727,541 | 2/1988 | Mori et al. | 370/111 X |
| 5,146,457 | 9/1992 | Veldhuis et al. | 370/111 |
| 5,150,363 | 9/1992 | Mitchell | 370/112 |

Primary Examiner—Douglas W. Olms
Assistant Examiner—Russell W. Blum
Attorney, Agent, or Firm—Robert E. Bushnell

[57] ABSTRACT

The present invention relates to a parallel data transferring and processing circuit which minimizes the number of necessary channels and mate the remote data transfer easy by reconstruction of parallel data after serial transfer of parallel data through a single channel. The parallel data are converted to the serial data by a serial conversion part and subsequently transferred through a single channel. An oscillation and control part controls the serial data and provide a synchronous signal to the serial data to be transferred. Next, the serial data transferred is again converted to the parallel data by a parallel conversion part. An oscillation and impulse generation part synchronizes the parallel conversion part with the serial conversion part. Finally, the parallel data is reconstructed to the original signal by a sample-and-hold circuit. Therefore, the present invention transfers and processes both analog and digital signal through a single channel.

25 Claims, 5 Drawing Sheets

PARALLEL DATA TRANSFERRING AND PROCESSING CIRCUIT

BACKGROUND OF THE INVENTION

The present invention relates to a parallel data transferring and processing circuit and more particularly to a circuit which minimizes the number of necessary channels and makes the remote data transfer feasible by reconstruction of parallel data after serial transfer of parallel data through a single channel.

In the past a custom integrated circuit (IC) MN6124 produced by MATSUSHITA corporation has been used for digital serial data processing between a video camera and a remote controller. This IC has an advantage that a single channel is used, but only digital data processing is possible. Thus, analog data processing is impossible and so additional peripheral circuits for analog data processing become, complex.

On the other hand, custom IC's such as M46015 and TP4508 used widely in the recent years can process both digital data and analog data, but have a problem that two channels must be prepared to process separately data and control signals. Thus, it is difficult to achieve analog and digital signal processing and single channel transfer simultaneously.

SUMMARY OF THE INVENTION

It is an object of the present invention to provide a parallel data transferring and processing circuit for transferring parallel data through a single channel as well as for processing both analog and digital signals.

According to the present invention, there is a parallel data transferring and processing circuit comprising:
- a serial conversion part for converting analog and digital parallel data to digital serial data and transferring them through a single channel,
- an oscillation and control part for controlling said serial conversion part and synchronizing serial data transferred from said serial conversion part by an oscillating output pulse with a predetermined frequency,
- a parallel conversion part for converting serial data transferred from said serial conversion part to parallel data,
- an oscillation and impulse generation part for providing a rest signal for synchronizing said parallel conversion part with said serial converter part by using a synchronous signal provided from said oscillation and control part as well as for controlling said parallel conversion part, and
- a sample-and-hold circuit part for reconstructing an original signal by sampling and holding the output data of said parallel conversion part.

BRIEF DESCRIPTION OF DRAWINGS

These and other objects, features, and advantages of the present invention will become more apparent from the following description for the preferred embodiments taken in conjunction with the accompanying drawings, in which.

DETAILED DESCRIPTION OF THE INVENTION

The present invention will be now described in more detail with reference to accompanying drawings.

Figure 1:
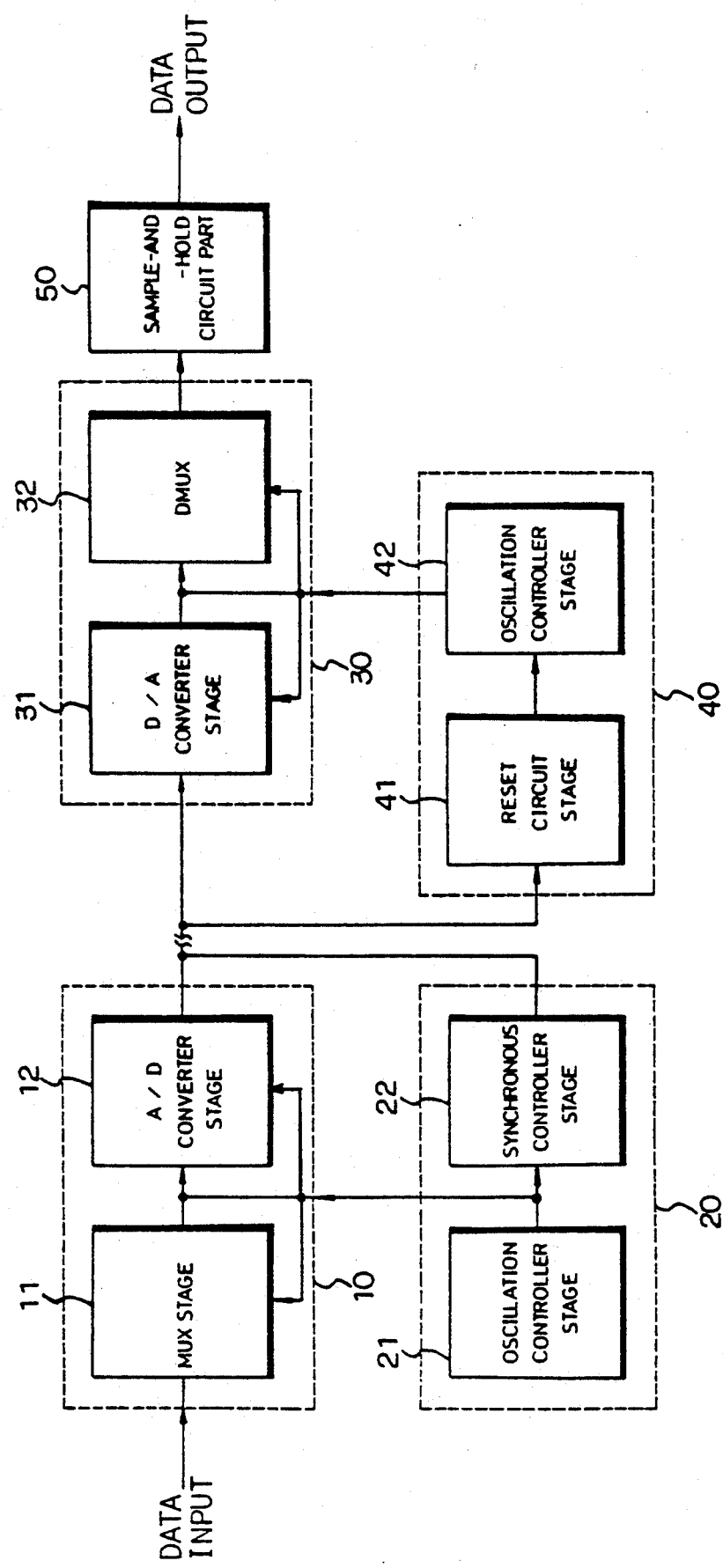
FIG. 1 is a block diagram of a parallel data transferring and processing circuit according to the present invention.

FIG. 1 shows a block diagram of a parallel data transferring and processing circuit according to the present invention.

The circuit comprises a serial conversion part 10 composed of a multiplexer stage 11 and an analog-to-digital (A/D) converter stage 12 for converting parallel data to serial data, an oscillation and control part 20 composed of an oscillation controller stage 21 and a synchronous controller stage 22 for controlling the serial conversion part 10 by providing an oscillating output pulse with a predetermined frequency and synchronizing the output data of the serial conversion part 10, a parallel conversion part 30 composed of a digital-to-analog (hereinafter termed D/A) converter stage 31 and a demultiplexer (hereinafter termed DMUX) stage 32 for converting the serial data transferred from the serial conversion part 10 to the parallel data, an oscillation and impulse generation part 40 composed of a reset circuit stage 41 and an oscillation controller stage 42 for providing a reset signal for synchronizing the parallel conversion part 30 with the serial conversion part 10 by using the output pulse of the oscillation and control part 20, and a sample-and-hold circuit part 50 for reconstructing the original signal by sampling and holding the parallel data provided from the parallel conversion part 30.

Figure 2A:
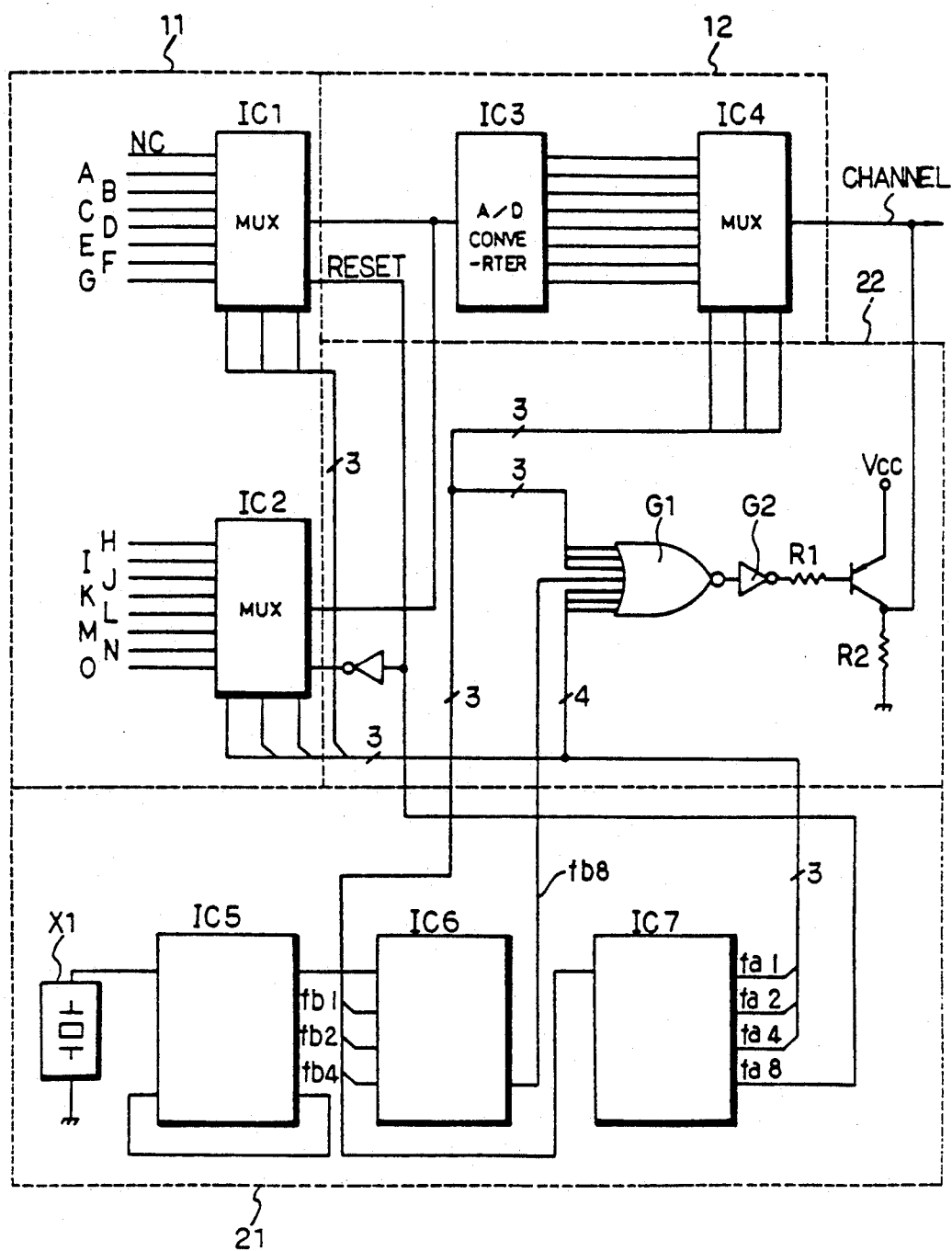
FIG. 2 (A) and (B) are detailed circuit diagram of FIG. 1: (A) transmitting System and (B) receiving system.
Figure 2B:
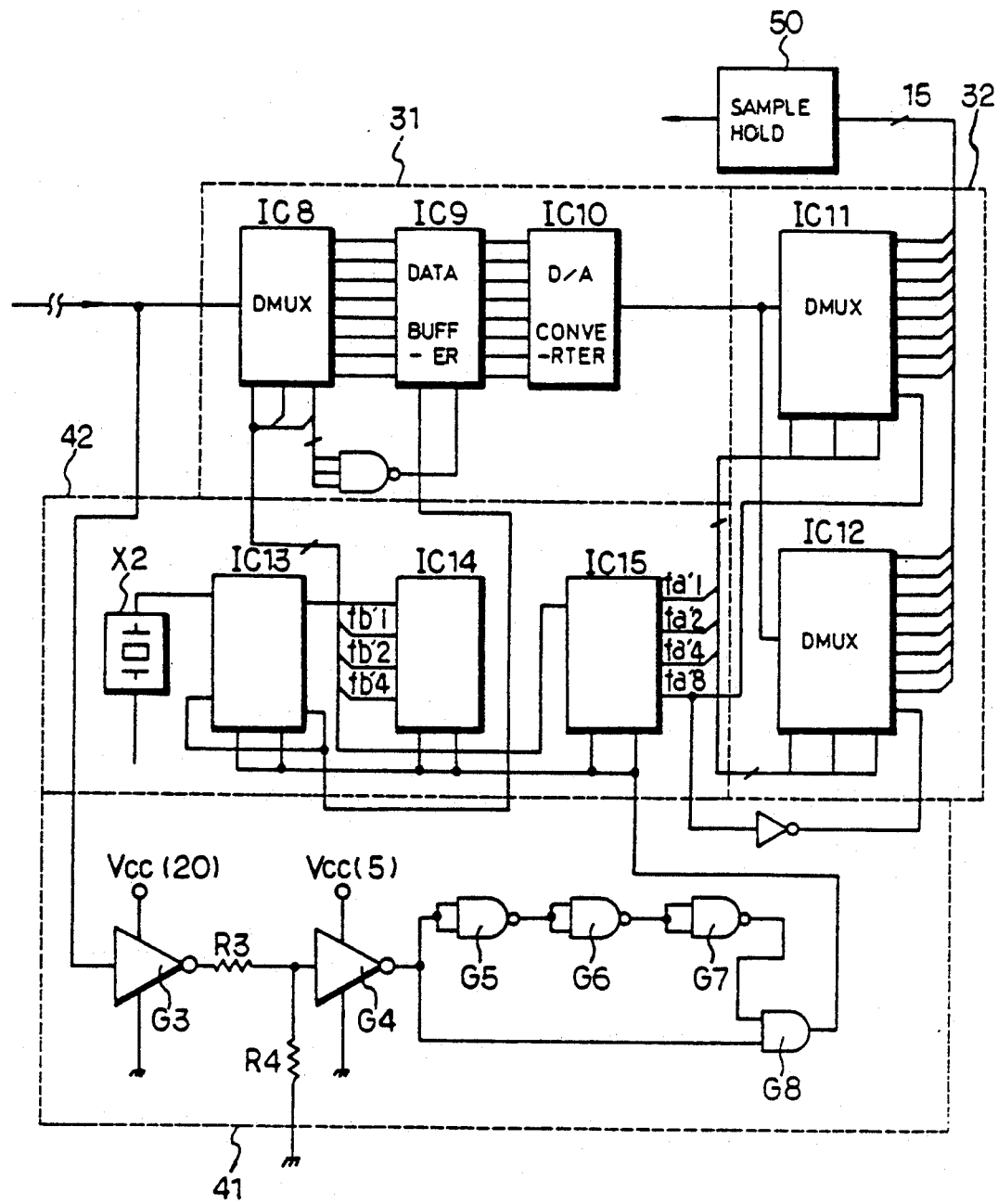

FIG. 2 (A) and (B) shows the detailed circuit diagrams of FIG. 1, wherein (A) is a detailed circuit diagram of the serial conversion part 10 and the oscillation and control part 20 and (B) is a detailed circuit diagram of the parallel conversion part 30, the oscillation and impulse generation part 40, and the sample-and-hold circuit part 50.

Referring to FIG. 2 (A) and (B), the multiplexer (hereinafter termed MUX) stage 11 comprises two 8-input, 1-output multiplexer's IC1 and IC2 to receive the parallel data through input terminals (A-O) and to transfer sequentially the data at the input terminals (A-O) in a predetermined time interval.

The A/D converter stage 12 comprises a A/D converter IC3 for converting the analog signal provided from the MUX IC1 to the digital signal and a MUX IC4 for converting the digital data of the A/D converter IC3 to the serial data to provide the serial data through a single channel after the analog-to-digital conversion of the data from the MUX IC1, followed by the parallel-to-serial conversion of the data of the A/D converter IC3.

The oscillation controller stage 21 comprises a 4-bit hexa counter IC5 for receiving a pulse of 500 kHz from a crystal oscillator X1 and providing a divided-by-8 pulse, a dual 4-bit hexa counter IC6 for, in response to the 500 kHz from the crystal oscillator X1, providing a divided-by-9 pulse and generating control signals fb1, fb2, fb4, (group designation fb) of the MUX IC4 in the A/D converter stage 12 by receiving the output pulse of the counter IC5 as an input clock, and a counter IC7 for, in response to the pulse of 500 kHz from the crystal oscillator X1, providing control signal fb4 in dividedby-11 pulse and generating control signals fa1, fa2, fa4, and fa8 (group designation fa) of the two MUX's IC1 and IC2 in the MUX stage 11, to control both the MUX stage 11 and the A/D converter stage 12.

The synchronous controller stage 22 comprises a 8-input NOR gate G1, an inverter G2, and a transistor Q1 provides the control signal '1' (for example 20V) when the control signals fa1, fa2, fa4, fb8, fb1, fb2 and fb4, are all '0'.

A D/A converter stage 31 in the parallel conversion part 30 comprise a DMUX IC8 for converting the serially transferred A/D converted data to the parallel data for D/A conversion, a buffer IC9 for providing the output data of the DMUX IC8, and a D/A converter IC10 for converting the 8-bit output signal of the buffer IC9 to the analog signal, to convert the serially transferred data to the parallel data and subsequently to convert the parallel digital signal to the analog signal.

The DMUX stage 32 comprises two DMUX's IC11 and IC12 for providing the data A-O, synchronous with the MUX IC1 and IC2, to convert the output of the D/A converter to the parallel data.

The reset circuit stage 41 comprises an inverter G3 for inverting the synchronous output pulse of the synchronous controller 22 from the serial data received through the channel, two resistors R3,R4 for dividing the output of the inverter G3, an inverter G4 for inverting the divided voltage, three NAND gates G5–G7 connected in series to the output terminal of the inverter G4, and an AND gate G8 of which two inputs are connected to the output terminals of the NAND gate G7 and the inverter G4, respectively, to generate an impulse output.

The oscillation controller stage 42 comprises three counters IC13–IC15 which are reset by the impulse output of the reset circuit stage 41. The oscillation controller stage 42 has the same configuration as the oscillation controller stage 21 in the oscillation and control part 20. That is, the counter IC13 receives the pulse of 500 kHz from the crystal oscillator X2 and provides a divided-by-8 pulse, and the counter IC13 receives the output pulse of the counter IC13 as a clock input and provides control signals fb′1, fb′2 and fb′4, (group designation fb′) for the DMUX IC8.

The counter IC14, in response to the 500 kHz from the crystal oscillator X2, provides its divided-by-9 pulse, and a counter 15, in response to the 500 kHz from the crystal oscillator X2, provides control signal fb′4 divided-by-11 pulse and generates the control signals fa′1, fa′2, fa′4, and fa′8 (totally called as fa′) for the DMUX's IC11 and IC12 by receiving the fb′4 signal of the counter IC13.

The parallel data transfer circuit, according to the present invention, provides the serial data by sequential switching of the data at the input terminals A–O if the input signals including both digital and analog components are applied at the input terminals A–O of the MUX stage 11 in the serial conversion part 10 as shown in FIG. 2 (A). The analog signal is a continuous signal varying between 0–5V, while the digital signal is either 5V or 0V.

The MUX's IC1 and IC2 provide the serial data including the analog signal by the control signal fa1, fa2, and fa4 from the counter IC7 in the oscillator controller stage 21.

Figure 3:
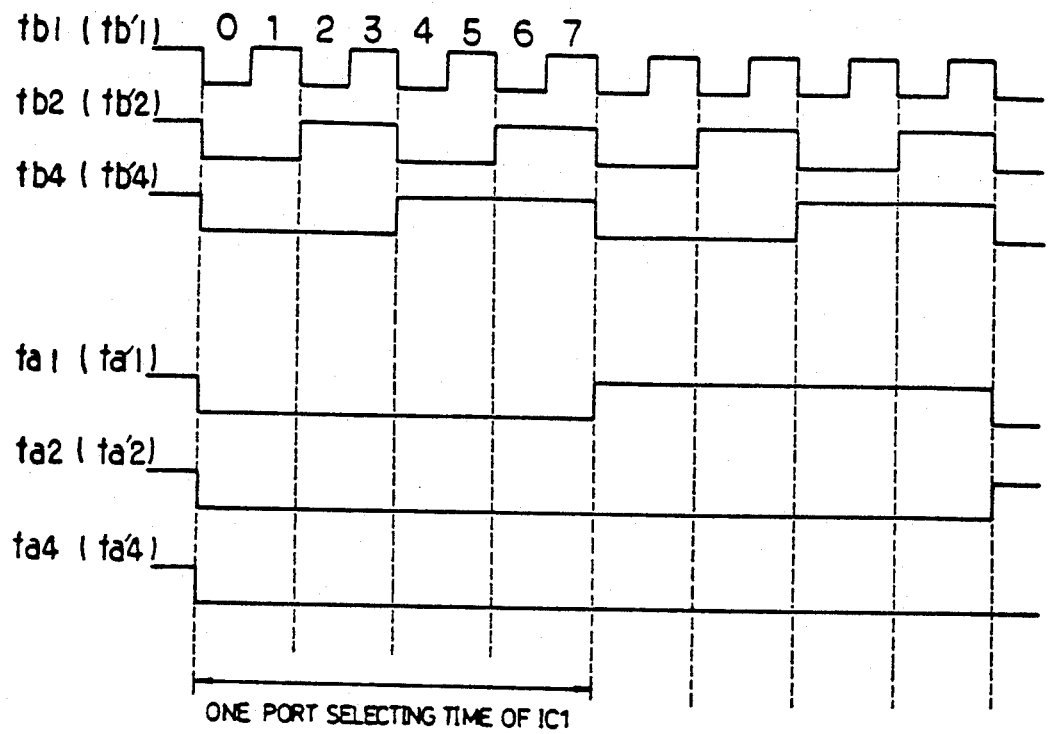
FIG. 3-5 are operating waveform diagrams of each part in FIG. 2 (A) and (B).

FIG. 3 shows an operating waveform diagram of the control outputs of the counters IC6 and IC14 in the oscillation controller stages 21 and 42. As shown in FIG. 3, the control signal fb2(fb′2) has one period every two periods of the control signal fb1(fb′1) and the control signal fb4(fb′4) has also one period every two periods of the control signal fb2(fb′2). The control signal fa1(fa′1) has one period every two periods of the control signal fb4(fb′4), and the control signal fa2(fa′2) has one period every two periods of the control signal fa1(fa′1) and finally the control signal fa4 (fa′4) has one period every two periods of the control signal fa2(fa′2).

The parallel data at the input terminal A–O of the MUX's IC1 and IC2 are sequentially provided IC3, and the serial data is provided as the 8-bit output by the A/D converter IC3. This 8-bit parallel data is converted to serial data by the MUX IC4 and the serial data is finally transferred through the channel. At this time, all of the control signals fa1, fa2, fa4, fa8, fb1, fb2 and fb4 are applied to each input terminal of the NOR gate G1 and so the output of the NOR gate G1 becomes '1' when the control signals are all '0', and subsequently the output of the inverter G2 becomes '0'.

Then, the transistor Q1 conducts and the supply voltage 20V is applied across the resistor R2 to an emitter terminal of a transistor Q1. Here, the time interval in which all of the control signals fa and fb are '0' is very short, thereby providing a pulse. This pulse are transferred through the channel together with the serial data and used as the synchronous signal since it is generated at a constant time interval.

The transferred signal is applied to the DA converter stage 31 where the DMUX IC8 converts the transferred serial data to parallel data and provides the parallel data through the buffer IC9 to the D/A converter IC10. The D/A converter IC10 converts the 8-bit parallel input data to an analog signal and subsequently provides the analog signal to the DMUX stage 32. Then, the DMUX's IC11 and IC12 in the DMUX stage 32 converts the analog signal to the parallel data and provides the parallel data to the sample-and-hold circuit part 50.

Figure 5:
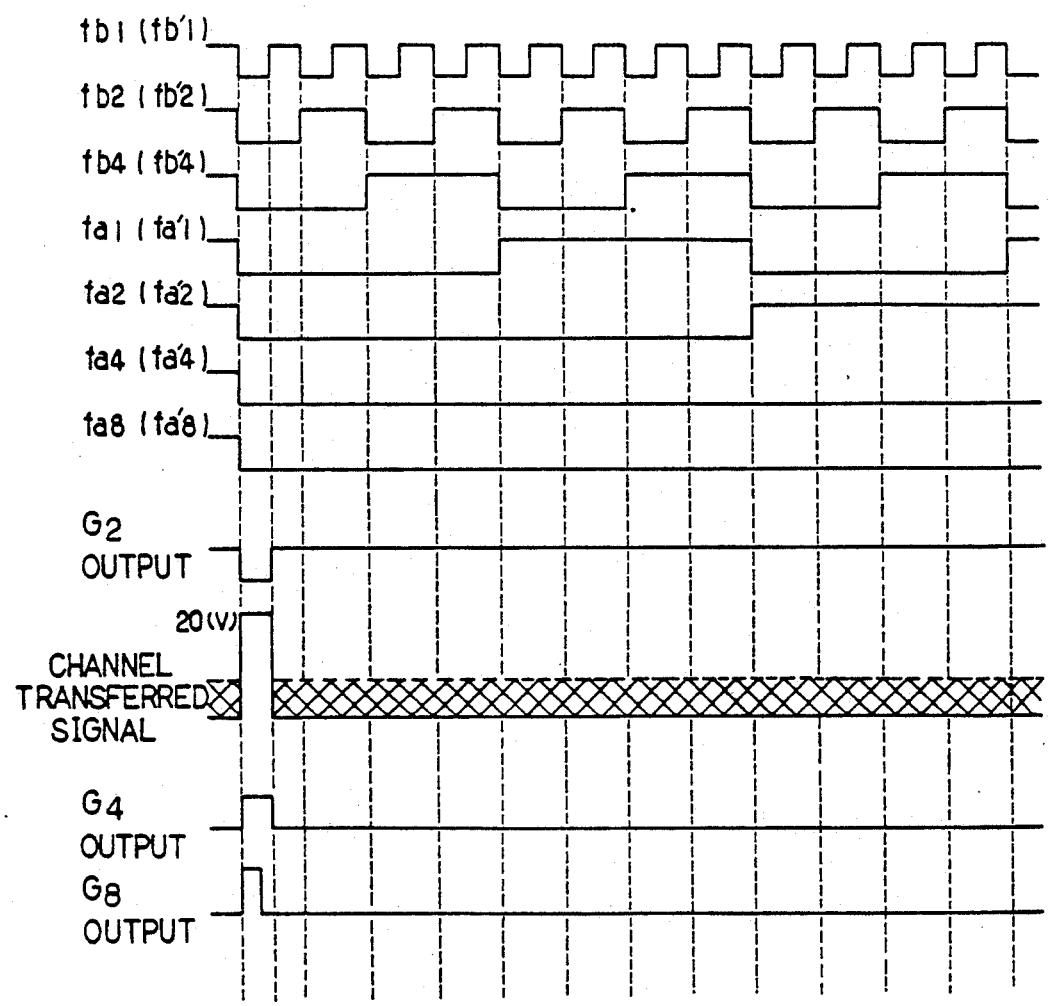

On the other hand, before this operation of the parallel conversion part 30, the reset circuit stage 41 in the oscillation and impulse generation part 40 receives a 20V peak signal from the inverter G3 as shown in FIG. 5 and provides only a 20V level by neglecting the component below 5V in the inverter G3. Thus, the output pulse of the synchronous controller part 22 is provided to inverter G3 and the output pulse provided to the inverter G4 after voltage division by the resistors R3 and R4.

Thus, the inverter G4 provides a 5V pulse, and this 5V pulse is applied to one input terminal of the AND gate G8 after delaying through the NAND gates G5, G6, and G7, and to the other input terminal directly. Thus, when two input signals at the input terminals of the AND gate G8, the delayed and undelayed signals, are overlapped with each other, an output pulse is generated. This output pulse has a very short width, an impulse.

This impulse resets the counters IC13, IC14, and IC15 in the oscillation controller stage 42 to initialize them, and then, the parallel conversion part 30 and the oscillation controller stage 42 are driven, synchronous with the data transferred from the serial conversion part 10.

As shown in FIG. 5, the reset signal, that is, the synchronous signal is generated when all of control signals fb1, fb2, fb4, fa1, fa2, fa4, and fa8 are '0', and at this instant, all of the control signals fb′1, fb′2, fb′4, fa′1, fa′2, fa′4, and fa′8 become '0'. Here, the frequency of the control signal fb1 is eight times that of the control signal fa1, and similarly the frequency of the control signal fb2 is eight times that of the control signal fa2. That is, the frequencies of the control signals fa are eight times higher that those of the control signals fb, and thus the control signals fb have the eight bits every one bit of the control signals fa.

When the phase difference between the output pulses of the crystal oscillators X1 and X2 connected respectively to the counters IC5 and IC13 is 180 degrees, the phase difference between the control signals fb1 and fb'1 is greatest, but, even in this case the shift time is very short, 1/512 of one period of the control signal fb1, so that the time error between the crystal oscillators X1 and X2 can be neglected and the pulse of the transmitting system composed of the serial conversion part 10 and the oscillation and control part 20 can be synchronized with the pulse of the receiving system composed of the parallel conversion part 30 and the oscillation and impulse generation part 40 during the data transfer. Thus, when the serial data is applied to the DMUX IC8 and is applied in parallel to the buffer IC9 after serial-to-parallel conversion by the DMUX IC8, the control signals fb1, fb2, and fb4 are nearly synchronized with the signals fb'1, fb'2, and fb'4, respectively.

Figure 4:
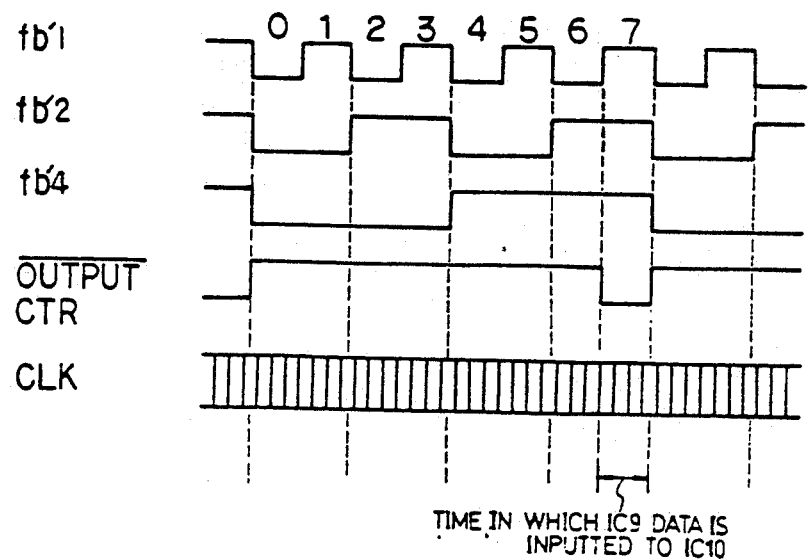

The buffer IC9 provides the waveform pulse shown in FIG. 4, that is, the output control signal(CTL) becomes '0' at the fourth interval (at this time, the control signal value is '1') of the control signal fb'1, and during this interval the 8-bit parallel data of the buffer IC9 is applied to the D/A converter IC10 to generate the analog signal. The analog output signal of the D/A converter IC10 is applied to the DMUX's IC11 and IC12 in the DMUX stage 32 and the MUX's IC11 ad IC12 are in turn driven, providing the analog signal in parallel. The output of the DMUX stage 32 is applied to the sample-and-hold circuit part 50 to reconstruct the original signal.

Figure 6:
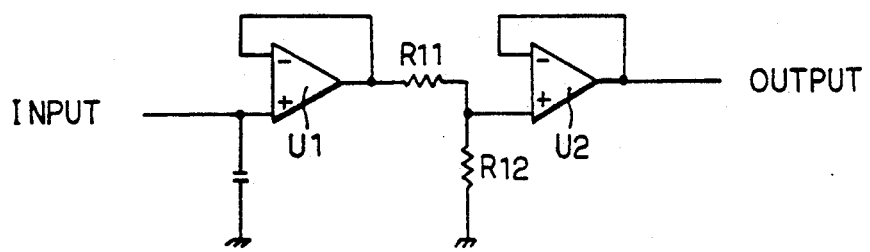
FIG. 6 is a detailed circuit diagram of an embodiment of the sample-and-hold circuit part in FIG. 1.

FIG. 6 shows an embodiment of the sample-and-hold circuit part 50 which comprises an operational amplifier U1 as a voltage follower, two voltage-diving resistors R11, R12, and an operational amplifier U2 as a voltage follower. The sample-and-hold circuit part 50 shown in FIG. 6 receives the 15 bit signal of the DMUX stage 32 and reconstructs the original signal.

As this, the analog and digital signals are converted to the serial data after the A/D conversion and are transferred through a single channel, and this transferred serial data are again converted to the parallel data after the D/A conversion and finally are reconstructed to the original data.

As mentioned until now, the present invention comprises the serial conversion part for converting the parallel analog and digital data to the serial digital data and transferring the serial digital data through a single channel, the oscillation and control part for providing the control signals to control the serial conversion part by an oscillating pulse with a predetermined frequency and synchronizing the serial data, the parallel conversion part for converting the serial data transferred from the serial conversion part through the channel to the parallel data, the oscillation and impulse generation part for providing the reset signal to synchronize the parallel conversion part with the serial conversion part by the synchronous signal generated from the oscillation and control part and controlling the parallel conversion part, and the sample-and-hold circuit part for reconstructing the original signal by sampling and holding of the output of the parallel conversion part, so that both of the control signal and data are transferred through a signal channel and also both of digital and analog signals are processed. Thus, the functionality can be largely improved and the peripheral circuits can be simple by the integration, thereby making the structure of the overall system simple.

What is claimed is:

1. A parallel data transferring and processing circuit, comprising:

serial conversion means for converting analog and digital parallel data signals to a digital serial data signal;

control means for controlling said serial conversion means and synchronizing said digital serial data signal in response to a first fixed frequency oscillating pulse;

parallel conversion means for converting said digital serial data signal to parallel data signals, said parallel conversion means comprising:

first demultiplexer means for converting said digital serial data signal to a first parallel signal, digital-to-analog converter means for converting the first parallel signal to an analog signal, and second demultiplexer means for converting the analog signal to said parallel data signals; and impulse generation means for providing a reset signal to synchronize said parallel conversion means with said serial conversion means, said reset signal being generated in response to said fixed frequency oscillating pulse.

2. The parallel data transferring and processing circuit, according to claim 1, wherein said control means comprises:

oscillation controller means for generating control signals to control said serial conversion means in response to said first fixed frequency oscillating pulse generated by an oscillator; and synchronous controller means for generating a synchronous pulse in response to said control signals.

3. The parallel data transferring and processing circuit according to claim 1, wherein said impulse generation means comprises:

reset circuit means for providing said reset signal generated from a synchronous pulse provided along with said digital serial data signal by said control means; and oscillation controller means for generating control signals to control said parallel conversion means, said control means being generated in response to a second fixed frequency oscillating pulse.

4. The parallel data transferring and processing circuit, according to claim 1, wherein said digital serial data signal is transmitted from said serial conversion means to said parallel conversion means on a single channel.

5. The parallel data transferring and processing circuit, according to claim 2, wherein said synchronous pulse is superimposed upon the digital serial data signal.

6. The parallel data transferring and processing circuit, according to claim 5, wherein said digital serial data signal varies between a first and second level, and wherein said synchronous pulse is an impulse of a third level.

7. A parallel data transferring and processing circuit, comprising:

serial conversion means for converting analog and digital parallel data signals to a digital serial data signal, said serial conversion means comprising:
  first multiplexer means for converting said analog and digital parallel data signals to a serial data signal,
  analog to digital converter means for converting said serial data signal to a digital data signal, and
  second multiplexer means for converting said digital data signal to said digital serial data signal;
control means for controlling said serial conversion means, said control means comprising:
  oscillation controller means for generating control signals to control said serial conversion means in response to a first fixed frequency oscillating pulse generated by an oscillator; and
  synchronous controller means for generating a synchronous pulse in response to said control signals;
parallel conversion means for converting said digital serial data signal to a parallel data signal in response to a synchronizing signal, said parallel conversion means comprising:
  first demultiplexer means for converting said digital serial data signal to a first, parallel signal;
  digital-to-analog converter means for converting the first parallel signal to an analog signal; and
  second demultiplexer means for converting the analog signal to said parallel data signal; and
means for providing said synchronizing signal to synchronize said parallel conversion means with said serial conversion means, said synchronizing signal being generated in response to counts of a clock signal initiated in response to said first fixed frequency oscillating pulse.

8. A parallel data transferring and processing circuit, comprising:
serial conversion means for converting analog and digital parallel data signals to a digital serial data signal, said serial conversion means comprising:
  first multiplexer means for converting said analog and digital parallel data signals to a serial data signal,
  analog to digital converter means for converting said serial data signal to a digital data signal, and
  second multiplexer means for converting said digital data signal to said digital serial data signal;
control means for generating control signals in response to a first fixed frequency oscillating pulse for controlling said serial conversion means;
parallel conversion means for converting said digital serial data signal to a parallel data signal in response to a synchronizing signal, said parallel conversion means comprising:
  first demultiplexer means for converting said digital serial data signal to a digital parallel signal;
  digital-to-analog converter means for converting the digital parallel signal to an analog signal; and
  second demultiplexer means for converting the analog signal to said parallel data signal; and
means for providing said synchronizing signal to synchronize said parallel conversion means with said serial conversion means, said synchronizing signal being generated in response to counts of a clock signal initiated in response to said first fixed frequency oscillating pulse.

9. The parallel data transferring and processing circuit according to claim 7, wherein said counts are generated in response to reception of a pulse superimposed on the digital serial data signal, said pulse being generated in response to said first fixed frequency oscillating pulse by said control means.

10. The parallel data transferring and processing circuit, according to claim 9, wherein said digital serial data signal varies between a first and second level, and wherein said pulse is at a third level.

11. The parallel data transferring and processing circuit according to claim 1, wherein said impulse generation means comprises reset circuit means for providing said reset signal by converting a synchronous pulse of said control means to an impulse; and oscillation controller means for resetting said digital-to-analog converter means and said first and second demultiplexer means in response to said impulse.

12. A serial data receiving and processing circuit, comprising:
  first means for demultiplexing digital serial data to generate received parallel data;
  digital-to-analog converting means for converting said received parallel data to time multiplexed signals; and
  second means for demultiplexing said time multiplexed signals to generate output parallel data signals;
  means for generating an oscillation signal; and
  means for generating stage control signals received by said first demultiplexing means and said second demultiplexing means in response to said oscillation signal.

13. A circuit as claimed in claim 12, further comprising means for resetting said stage control signal generating means in response to transmission control signals superimposed upon said digital serial data.

14. A parallel data transferring and processing circuit, comprising:
  first means for multiplexing input parallel data signals received on a plurality of data lines to generate input serial data signals;
  analog-to-digital converting means for converting said input serial data signals to input digital data;
  second means for multiplexing said input digital data to generate digital serial data;
  first means for demultiplexing said digital serial data to generate received parallel data;
  digital-to-analog converting means for converting said received parallel data to time multiplexed signals; and
  second means for demultiplexing said time multiplexed signals to generate output parallel data signals.

15. A circuit as claimed in claim 14, wherein said input parallel data signals comprise signals in an analog and digital format.

16. A circuit as claimed in claim 14, further comprising:
  means for generating a transmitter oscillation signal;
  means for generating transmitter stage control signals received by said first multiplexing means and said second multiplexing means in response to said transmitter oscillation signal; and
  synchronous controlling means for generating transmission control signals in response to said transmitter stage control signals.

17. A circuit as claimed in claim 16, wherein said transmission control signals are superimposed upon said digital serial data.

18. A circuit as claimed in claim 16, further comprising:
  means for generating a receiver oscillation signal; and
  means for generating receiver stage control signals received by said first demultiplexing means and said second demultiplexing means in response to counts of said receiver oscillation signal.

19. A circuit as claimed in claim 18, further comprising means for resetting said counts in response to said transmission control signals.

20. A circuit as claimed in claim 17, further comprising:
  means for generating a receiver oscillation signal; and
  means for generating receiver stage control signals received by said first demultiplexing means and said second demultiplexing means in response to said receiver oscillation signal.

21. A circuit as claimed in claim 18, further comprising means for resetting said counts in response to said transmission control signals.

22. A circuit as claimed in claim 14, further comprising:
  means for selectively connecting an output line of said second multiplexing means to a voltage source in response to counts of an oscillation signal so as to generate a control signal to be transmitted with said digital serial data, said control signal having a voltage level distinguishable from possible voltage levels of said digital serial data, said output line providing said digital serial data.

23. A method for transmitting parallel signals in a channel, said method comprising:
  multiplexing input parallel data signals received on a plurality of data lines to generate input serial data signals;
  converting said input serial data signals to input digital data;
  multiplexing said input digital data to generate digital serial data;
  demultiplexing said digital serial data to generate received parallel data;
  converting said received parallel data to time multiplexed signals; and
  demultiplexing said time multiplexed signals to generate output parallel data signals.

24. A method as claimed in claim 23, further comprising:
  generating transmission control signals in response to oscillation signals and superimposing said transmission control signals on said digital serial data.

25. A method as claimed in claim 24, further comprising:
  generating a receiver oscillation signal; and
  generating receiver stage control signals received by said first demultiplexing means and said second demultiplexing means in response to counts of said receiver oscillation signal reset in response to said transmission control signals.

* * * * *

UNITED STATES PATENT AND TRADEMARK OFFICE
CERTIFICATE OF CORRECTION

PATENT NO. : 5,333,136
DATED : July 26, 1994
INVENTOR(S) : Byung Eui Ahn

It is certified that error appears in the above-indentified patent and that said Letters Patent is hereby corrected as shown below:

TITLE PAGE item: [75], Inventor's name, Change "Byung E. Ahn" to --Byung Eui Ahn--.

Title page, abstract item: [57], Line 3, Change "mate" to --make-- .

Column 1, Line 20, After "become", Delete comma "," .

Column 6, Line 52, Change "means" to --signals-- ;

Column 7, Line 25, After "first", Insert comma --,-- .

Signed and Sealed this

Fifth Day of September, 1995

Attest:

BRUCE LEHMAN

*Attesting Officer*  *Commissioner of Patents and Trademarks*